United States Patent
Nasu et al.

(10) Patent No.: US 7,850,056 B2
(45) Date of Patent: Dec. 14, 2010

(54) ELECTRONIC COMPONENT MOUNTING APPARATUS AND ELECTRONIC COMPONENT MOUNTING METHOD

(75) Inventors: Hiroshi Nasu, Osaka (JP); Katsuhiko Watanabe, Osaka (JP); Hiroyuki Imamura, Osaka (JP); Hiroshi Ebihara, Osaka (JP); Hiroyuki Kobayashi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/532,741

(22) PCT Filed: Feb. 28, 2008

(86) PCT No.: PCT/JP2008/000374

§ 371 (c)(1),
(2), (4) Date: Sep. 23, 2009

(87) PCT Pub. No.: WO2008/139668

PCT Pub. Date: Nov. 20, 2008

(65) Prior Publication Data

US 2010/0065613 A1   Mar. 18, 2010

(30) Foreign Application Priority Data

Apr. 27, 2007   (JP) .............................. 2007-118211

(51) Int. Cl.
*B23K 1/06*   (2006.01)
(52) U.S. Cl. ..................................... 228/110.1; 228/1.1
(58) Field of Classification Search ........................ None
See application file for complete search history.

(56) References Cited

U.S. PATENT DOCUMENTS

| | | | | | |
|---|---|---|---|---|---|
| 3,750,926 | A | * | 8/1973 | Sakamoto et al. | 228/1.1 |
| 4,131,505 | A | * | 12/1978 | Davis, Jr. | 156/580.1 |
| 4,374,697 | A | * | 2/1983 | Tsuzuki et al. | 156/580.2 |
| 5,057,182 | A | * | 10/1991 | Wuchinich | 156/580.1 |
| 5,096,532 | A | * | 3/1992 | Neuwirth et al. | 156/580.1 |
| 5,110,403 | A | * | 5/1992 | Ehlert | 156/580.1 |
| 5,607,528 | A | * | 3/1997 | Choudhury | 156/73.2 |
| 5,715,590 | A | * | 2/1998 | Fougere et al. | 29/564.1 |
| 5,820,011 | A | * | 10/1998 | Ito et al. | 228/1.1 |
| 5,868,301 | A | * | 2/1999 | Distefano et al. | 228/180.21 |
| 6,168,063 | B1 | * | 1/2001 | Sato et al. | 228/1.1 |
| 6,247,628 | B1 | | 6/2001 | Sato et al. | |
| 6,494,359 | B1 | * | 12/2002 | Hasegawa | 228/102 |
| 6,523,732 | B1 | * | 2/2003 | Popoola et al. | 228/1.1 |

(Continued)

FOREIGN PATENT DOCUMENTS

JP   60-161775   8/1985

(Continued)

*Primary Examiner*—Kiley Stoner
(74) *Attorney, Agent, or Firm*—Hamre, Schumann, Mueller & Larson, P.C.

(57) ABSTRACT

In a direction parallel to a direction 5 of ultrasonic vibrations imparted from an ultrasonic vibrator 1, the shape of a center portion 3*a* of a tool 3 and the shape of an end portion 3*b* of the tool 3 are changed such that the cross-sectional areas are different, whereby ultrasonic amplitudes 9 in a direction perpendicular to the direction 5 of ultrasonic vibrations are substantially equal. By this means, the difference in ultrasonic vibration between at the center portion 3*a* of the tool 3 and at the end portion 3*b* of the tool 3 can be eliminated or reduced.

5 Claims, 11 Drawing Sheets

U.S. PATENT DOCUMENTS

| | | | |
|---|---|---|---|
| 6,543,668 B1 | 4/2003 | Fuji et al. | |
| 6,776,323 B2* | 8/2004 | Schmidt | 228/1.1 |
| 6,840,424 B2* | 1/2005 | Sung | 228/4.5 |
| 6,877,648 B2* | 4/2005 | Higashiyama | 228/1.1 |
| 7,122,097 B2* | 10/2006 | Rabe | 156/580.2 |
| 7,156,281 B2* | 1/2007 | Hizukuri et al. | 228/110.1 |
| 7,377,416 B2* | 5/2008 | Yu et al. | 228/110.1 |
| 7,392,923 B2* | 7/2008 | Stroh et al. | 228/1.1 |
| 7,424,966 B2* | 9/2008 | Kainuma et al. | 228/110.1 |
| 2002/0066767 A1* | 6/2002 | Takahashi et al. | 228/110.1 |
| 2003/0038158 A1* | 2/2003 | Takahashi et al. | 228/110.1 |
| 2003/0160084 A1* | 8/2003 | Higashiyama | 228/1.1 |
| 2004/0046007 A1* | 3/2004 | Reiber et al. | 228/180.5 |
| 2004/0065711 A1* | 4/2004 | Sung | 228/4.5 |
| 2004/0211812 A1 | 10/2004 | Hizukuri et al. | |
| 2005/0028942 A1* | 2/2005 | Rabe | 156/580.1 |
| 2005/0199676 A1* | 9/2005 | Stroh et al. | 228/1.1 |
| 2005/0247408 A1* | 11/2005 | Jung | 156/580.1 |
| 2006/0000870 A1* | 1/2006 | Matsumura | 228/1.1 |
| 2006/0071048 A1* | 4/2006 | Yu et al. | 228/1.1 |
| 2006/0090833 A1 | 5/2006 | Matsumura et al. | |
| 2007/0114268 A1* | 5/2007 | Ishii et al. | 228/183 |
| 2007/0199972 A1* | 8/2007 | Chong et al. | 228/1.1 |
| 2008/0048004 A1* | 2/2008 | Ozaki et al. | 228/1.1 |
| 2008/0087708 A1* | 4/2008 | Ozaki et al. | 228/1.1 |
| 2008/0190993 A1* | 8/2008 | Delsman et al. | 228/110.1 |
| 2008/0265002 A1* | 10/2008 | Kainuma et al. | 228/1.1 |
| 2008/0265003 A1* | 10/2008 | Kainuma et al. | 228/110.1 |
| 2009/0200358 A1* | 8/2009 | Violleau et al. | 228/110.1 |

FOREIGN PATENT DOCUMENTS

| | | |
|---|---|---|
| JP | 11-074315 | 3/1999 |
| JP | 2001-038291 | 2/2001 |
| JP | 2002-141374 | 5/2002 |
| JP | 2004-327590 | 11/2004 |
| JP | 2004-330228 | 11/2004 |
| JP | 2004-349655 | 12/2004 |
| JP | 2005-311103 | 11/2005 |
| JP | 2005-322716 | 11/2005 |

* cited by examiner

FIG. 3
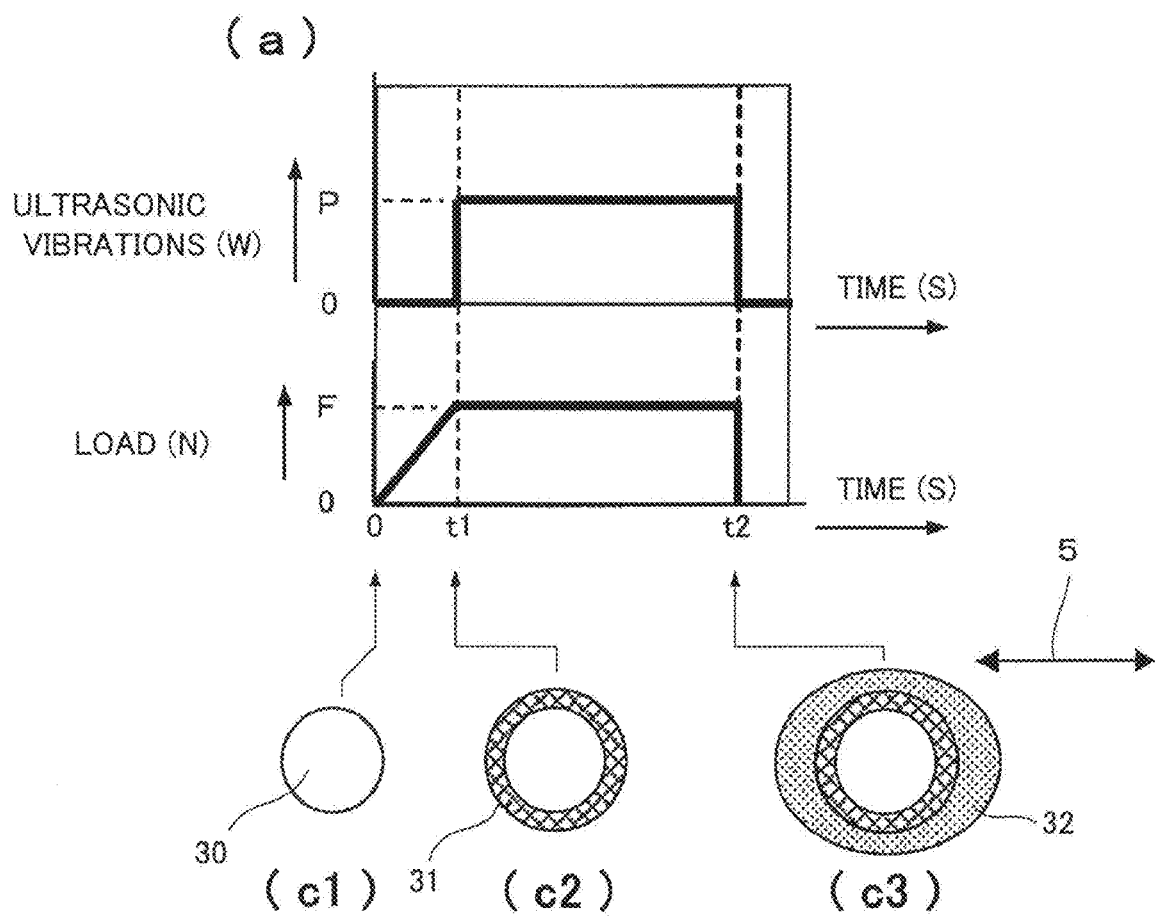
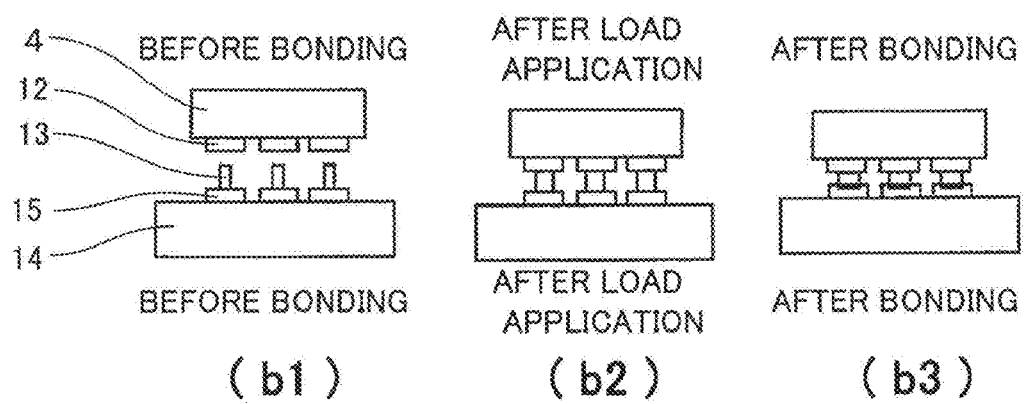

42 HOLE PORTION

43 HOLE PORTION

FIG. 12
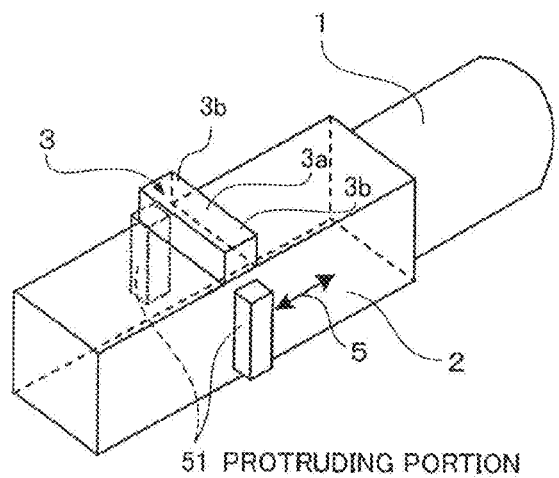
FIG. 13
PRIOR ART
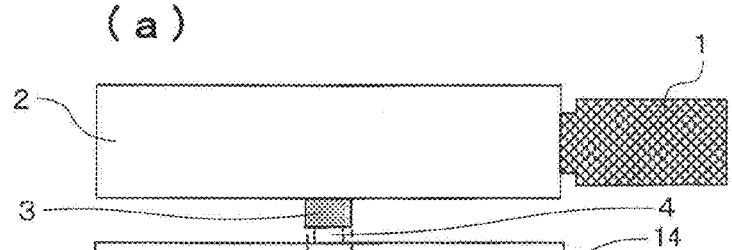
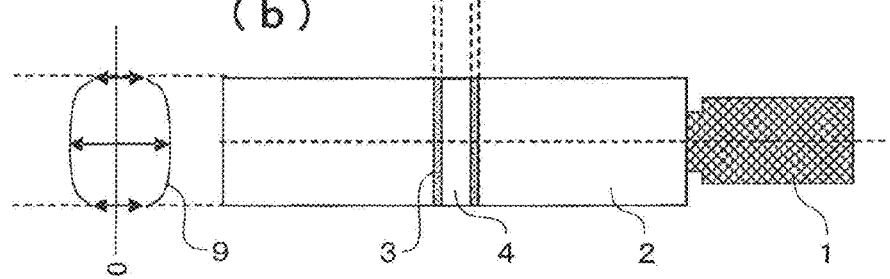

ELECTRONIC COMPONENT MOUNTING APPARATUS AND ELECTRONIC COMPONENT MOUNTING METHOD

TECHNICAL FIELD

This invention relates to an electronic component mounting apparatus and an electronic component mounting method for mounting the metal electrodes of electronic components and the metal electrodes of wiring boards using ultrasonic vibration.

BACKGROUND ART

In apparatuses of the prior art which mount electronic components on printed boards and other wiring boards, various methods are employed to bond the electrodes of the electronic components to the electrodes of the wiring boards; one known method of mounting electronic components in a short time and at comparatively low temperatures is a bonding method employing ultrasound (hereafter called ultrasonic bonding).

In ultrasonic bonding, an electronic component pressed against a wiring board is vibrated by ultrasonic vibration, and the electrodes of the electronic component (with bumps formed, for example) and the electrodes of the wiring board are electrically bonded. At this time, the bumps may be formed on the electrodes of the wiring board, or may be formed both on the electrodes of the electronic component and on the electrodes of the wiring board.

Explanatory diagrams of (a) and (b) in FIG. 13 show a state in which conventional ultrasound is used to perform bonding of the metal electrodes of an electronic component 4 to the metal electrodes of a wiring board 14 using an electronic component mounting apparatus (hereafter called an "ultrasonic bonding apparatus"), which mounts electronic components 4 onto wiring boards 14; 1 is an ultrasonic vibrator, 2 is an ultrasonic horn, and 3 is a tool.

In (a) of FIG. 13, a cross-sectional view is shown, and in (b) of FIG. 13 the figure on the right is a base view with the wiring board 14 omitted, while in (b) of FIGS. 3, 9 is the figure on the left is an ultrasound amplitude with no loading, and the quantity of transmission of ultrasonic vibration during the application of a load is shown in a pseudo manner.

As shown in (a) of FIG. 13, ultrasonic vibration generated by the ultrasonic vibrator 1 is transmitted to the electronic component 4 via the ultrasonic horn 2 that transmits the ultrasonic vibration and via the tool 3 in direct contact with the loaded electronic component 4, and the electrodes on the electronic component 4 are bonded with the electrodes of the wiring board 14.

FIG. 14 is an explanatory diagram showing the relation between loading conditions for loading the bonded portions of the electronic component and ultrasonic vibration conditions, and non-defective and defective items of the bonded portions of the electronic component. The horizontal axis represents the loading conditions for loading each bonded portion, and the vertical axis represents the ultrasonic vibration.

As shown in FIG. 14, in an area B of light loading or of low ultrasonic vibration, the load energy is insufficient for bonding, so that there is electrical discontinuity at bonded portions where the electrodes of the electronic component 4 and the electrodes of the wiring board 14 are not bonded, or there is insufficient bonding strength to secure the reliability required of a product (for example, the shear strength of the electronic component 4 with respect to the wiring board 14), or other bonding defects arising from insufficient bonding strength occur.

Further, in an area C of high loading or of high ultrasonic vibration, excessive loading energy causes breakage of the electronic component 4 or of the wiring board 14.

Hence there is a need to set the load value and ultrasonic vibration value, as the bonding conditions, within a range in which the bonding strength needed to secure the reliability demanded of products can be secured, and moreover breakage of the electronic component 4 or of the wiring board 14 does not occur. In an area A it is possible to achieve favorable bonding of the electronic component 4 and wiring board 14 with an appropriate load and appropriate ultrasonic vibration.

Patent Reference 1: Japanese Patent Application Laid-Open No. 2004-330228

In recent years, ultrasonic bonding methods have been recognized as superior, in enabling bonding of electronic components in short times and at comparatively low temperatures, over other bonding methods for bonding the electrodes of electronic components and the electrodes of wiring boards, such as bonding methods in which bumps formed on the electrodes of electronic components are bonded to bumps formed on the electrodes of wiring boards via conductive adhesive, bonding methods in which bumps formed on the electrodes of electronic components and the electrodes of wiring boards are bonded via adhesive sheet comprising conductive particles, or bonding methods in which solder bumps formed on electronic components are bonded to the electrodes of wiring boards; and so the application of ultrasonic bonding to numerous forms of electronic component bonding is anticipated.

In particular, in forms of electronic component bonding of driver ICs for image displays and other large components, in which the electrode pitch is expected to continue to decrease, thermal expansion of constituent members due to thermal loading at the time of bonding causes shifts in bonding position and other problems, so that great expectations are being placed on ultrasonic bonding methods enabling bonding at low temperatures.

In ultrasonic bonding, in order to transmit ultrasonic vibrations from the tool to the entire face of the electronic component, the lengths of the tool perpendicular to and parallel to the ultrasonic vibration direction are set to be the same as the lengths of the electronic component perpendicular to and parallel to the ultrasonic vibration direction. Alternatively, the lengths of the tool perpendicular to and parallel to the ultrasonic vibration direction of the electronic component are set to be longer than the lengths perpendicular to and parallel to the ultrasonic vibration direction. Moreover, the lengths of the tool perpendicular to the ultrasonic vibration direction are set to be the same at the component-holding face of the tool, and the lengths of the tool parallel to the ultrasonic vibration direction are set to be the same at the component-holding face.

However, given such a tool shape, the farther a region in the tool from the center line of the tool parallel to the ultrasonic vibration direction, the poorer the transmission of ultrasonic vibrations.

That is, as shown in (b) of FIG. 13, changes occur in the ultrasound amplitude 9 at the center portion of the tool 3 and the ends of the tool 3, that is, a difference occurs in transmission of ultrasonic vibration. In particular, at the ends of the tool 3, the transmission of ultrasonic vibrations is extremely small.

As explained above, the bonding conditions of ultrasonic bonding has to be bonding conditions in the area A, in which the electrodes of the electronic component are bonded to the electrodes of the wiring board, and no breakage occurs; but if a difference occurs in the transmission of ultrasonic vibrations to the electrodes in the center portion of the electronic component and to electrode portions at the ends, the bonding conditions to be actually imposed at different bonded portions in the electronic component have a range, for example, as shown in FIG. 14, and it is not possible to find bonding conditions satisfying both the requirement of securing bonding strength at all the bonded portions in the electronic component and the requirement that there be no breakage of the electronic component or the wiring board. In FIG. 14, a range D1 represents a range of actually imposed bonding conditions at ends perpendicular to the ultrasonic vibration direction of the electronic component. A range D2 represents a range of actually imposed bonding conditions at areas other than the ends perpendicular to the ultrasonic vibration direction of the electronic component.

Alternatively, even if bonding conditions are discovered satisfying both the requirement of securing bonding strength at all bonded portions in the electronic component, and the requirement that there be no breakage of the electronic component or of the wiring board, the bonding conditions have small margins for securing non-defective products, and the maintenance of the bonding conditions in mass production is extremely difficult.

DISCLOSURE OF THE INVENTION

This invention has been devised in light of these problems of the prior art. An object of the invention is to facilitate the maintenance of bonding conditions in mass production, by discovering conditions satisfying both the requirement of either eliminating the difference in ultrasound amplitude at the tool center portion and at the tool end portions in ultrasonic bonding, that is, eliminating the difference in transmission of ultrasonic vibrations, or reducing the difference in transmission of ultrasonic vibrations to secure bonding strength at all the bonded portions in the electronic component, and the requirement that there be no breakage of the electronic component or wiring board, and also by securing a bonding condition range with a large margin in order to secure non-defective products.

An electronic component mounting apparatus according to a first aspect of the invention is an electronic component mounting apparatus which transmits ultrasonic vibrations generated from an ultrasonic vibrator, via an ultrasonic horn and a tool, to an electronic component on a wiring board, and which causes the electronic component and the wiring board to be bonded to each other, wherein the cross-sectional area of a center portion, passing through a center axis of the ultrasonic vibrator, in the tool perpendicular to a contact face with the electronic component is set to be larger than cross-sectional areas in other regions of the tool.

An electronic component mounting apparatus according to a second aspect of the invention is the apparatus of the first aspect, wherein the length of the center portion of the contact face with the electronic component in the tool parallel to an ultrasonic vibration direction is set to be greater than the length of an end portion of the contact face with the electronic component in the tool.

An electronic component mounting apparatus according to a third aspect of the invention is the apparatus of the first aspect, wherein in a side face of the tool, a groove portion is formed parallel to the direction of ultrasonic vibrations imparted from the ultrasonic vibrator.

An electronic component mounting apparatus according to a fourth aspect of the invention is the apparatus of the first aspect, wherein two hole portions are formed perpendicular to the direction of ultrasonic vibrations imparted from the ultrasonic vibrator in a side face of the tool, and the two hole portions are placed in positions which are symmetrical with respect to the center axis of the ultrasonic vibrator.

An electronic component mounting apparatus according to a fifth aspect of the invention is an electronic component mounting apparatus which transmits ultrasonic vibrations generated from an ultrasonic vibrator, via an ultrasonic horn and a tool, to an electronic component on a wiring board, and which causes the electronic component and the wiring board to be bonded to each other, wherein the cross-sectional area of a center portion, passing through the center axis of the ultrasonic vibrator, in the tool perpendicular to a contact face with the electronic component is set to be smaller than cross-sectional areas in other regions of the tool.

An electronic component mounting apparatus according to a sixth aspect of the invention is the apparatus of the fifth aspect, wherein a hole portion is formed in a side face of the tool perpendicular to the direction of ultrasonic vibrations imparted from the ultrasonic vibrator, and the hole portion is placed such that the center line of the hole portion exists in the tool in a plane passing through the center portion of the contact face with the electronic component and the center axis of the ultrasonic vibrator.

An electronic component mounting apparatus according to a seventh aspect of the invention is the apparatus of the fifth aspect, wherein a groove portion is formed in the center portion of an electronic component holding face of the tool.

An electronic component mounting apparatus according to an eighth aspect of the invention is an electronic component mounting apparatus which transmits ultrasonic vibrations generated from an ultrasonic vibrator, via an ultrasonic horn and a tool, to an electronic component on a wiring board, and which causes the electronic component and the wiring board to be bonded to each other, wherein the material of a center portion, passing through the center axis of the ultrasonic vibrator, in the tool perpendicular to a contact face with the electronic component is different from material in other regions of the tool.

An electronic component mounting apparatus according to a ninth aspect of the invention is an electronic component mounting apparatus which transmits ultrasonic vibrations generated from an ultrasonic vibrator, via an ultrasonic horn and a tool, to an electronic component on a wiring board, and which causes the electronic component and the wiring board to be bonded to each other, wherein the material texture of a center portion, passing through the center axis of the ultrasonic vibrator, in the tool perpendicular to a contact face with the electronic component is different from material texture in other regions of the tool.

An electronic component mounting method according to a tenth aspect of the invention is an electronic component mounting method of mounting an electronic component on a wiring board employing ultrasound, by using the electronic component mounting apparatus according to any one of the first to sixth aspects, wherein provided are a tool whose shape in a center portion parallel to the direction of ultrasonic vibrations imparted from an ultrasonic vibrator is changed from a shape in an end portion, and an ultrasonic horn for holding the tool, the method including the steps of: imparting ultrasonic vibrations from the ultrasonic vibrator to the electronic component via the ultrasonic horn and the tool holding the electronic component; and pressing the electronic component against the wiring board, with a support member on which the ultrasonic horn is mounted, the ultrasonic horn, and the tool therebetween.

An electronic component mounting method according to an eleventh aspect of the invention is an electronic component mounting method of mounting an electronic component on a wiring board by using the electronic component mounting apparatus according to the eighth or ninth aspect employing ultrasound, wherein provided are a tool whose material texture perpendicular to the direction of ultrasonic vibrations in a center portion parallel to the direction of ultrasonic vibrations imparted from an ultrasonic vibrator is changed from material texture perpendicular to the direction of ultrasonic vibrations in an end portion, and an ultrasonic horn for holding the tool, the method including the steps of: imparting ultrasonic vibrations from the ultrasonic vibrator to the electronic component via the ultrasonic horn and the tool holding the electronic component; and pressing the electronic component against the wiring board, with a support member on which the ultrasonic horn is mounted, the ultrasonic horn, and the tool therebetween.

According to this invention, a difference in ultrasonic amplitude between at the tool center portion and at the tool end portion in ultrasonic bonding, that is, a difference in the transmission of ultrasonic vibrations is eliminated, or the difference in the transmission of ultrasonic vibrations is reduced, so that both the requirement of securing bonding strength at all bonded portions in the electronic component and the requirement that there be no breakage of the electronic component or the wiring board can be satisfied. Further, a range of bonding conditions with a large margin can be secured in order to secure non-defective products, so that the maintenance of bonding conditions in mass production is facilitated.

BRIEF DESCRIPTION OF THE DRAWINGS

FIG. 3 shows profiles of ultrasonic vibration conditions and loading conditions according to the embodiment, and an electronic component and a portion where the electronic component is placed at different times during bonding, in which (a) shows the ultrasonic vibrations and loading conditions profiles, (b1) through (b3) are cross-sectional views showing the configuration of the electronic component, a wiring board, and a bonding material at different times during bonding, and (c1) through (c3) show the area of the contact faces of electrodes on the electronic component with the bonding material arranged between the electronic component and the wiring board, at different times during bonding;

FIG. 12 is a perspective view showing the tool of the ultrasonic bonding apparatus according to this embodiment of the invention, from the direction of the component holding face;

FIG. 13 is an explanatory diagram showing the state of performing bonding of an electronic component and a wiring board by an ultrasonic bonding apparatus of the prior art, in which (a) is a front view, the right in (b) is a bottom view excluding the wiring board, and the left in (b) is an explanatory diagram showing the relation between a position on a tool and the ultrasonic amplitude when there is no loading; and, FIG. 14 explains the relation between loading conditions for loading at each bonded portion and ultrasonic vibration conditions of the electronic component in the prior art apparatus, and non-defective products and defective products for each bonded portion of the electronic component.

BEST MODE FOR CARRYING OUT THE INVENTION

Below, embodiments of the invention are explained, based on FIG. 1 through FIG. 12.

Embodiment 1

FIG. 1 through FIG. 10 show this embodiment of the invention.

Figure 1:
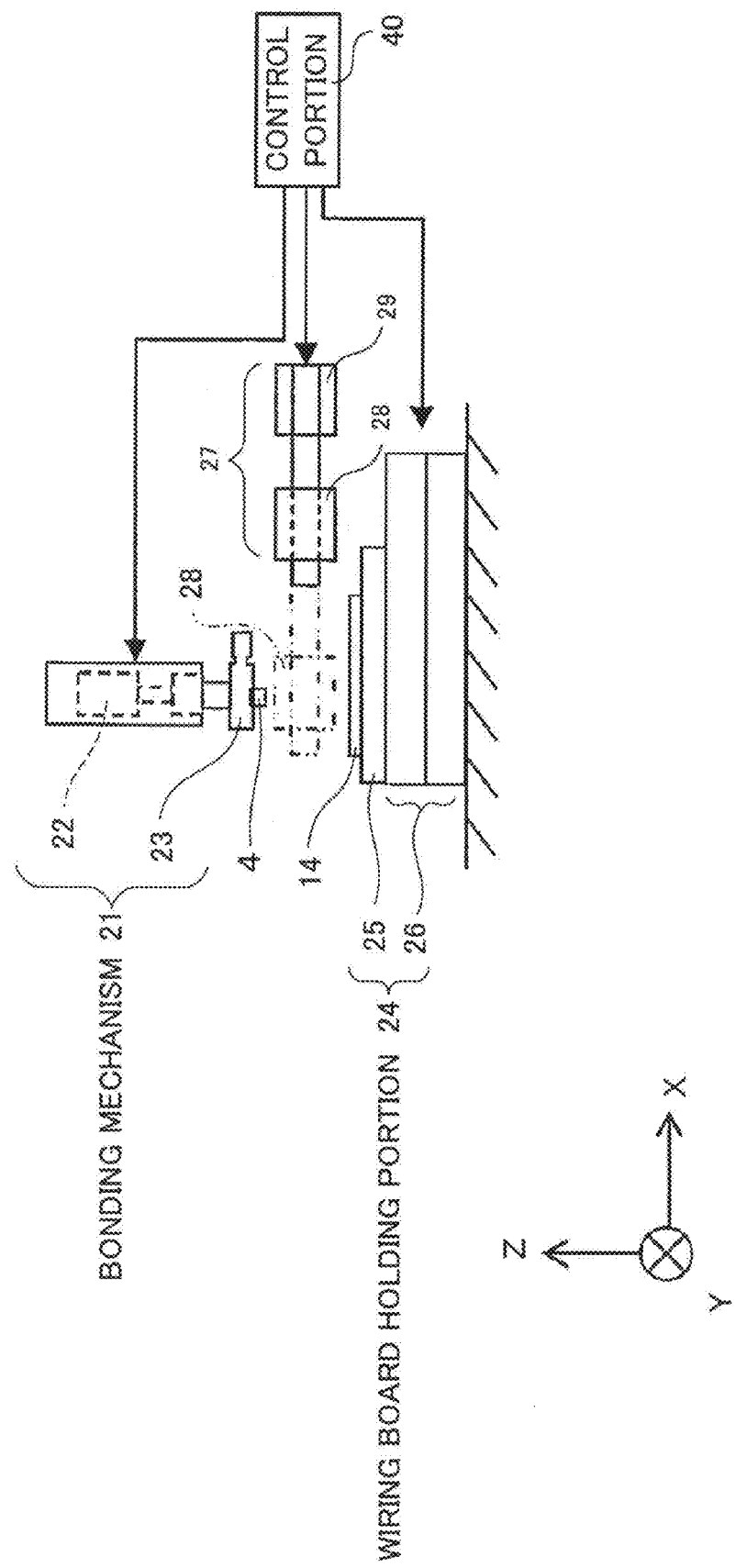
FIG. 1 is a schematic configuration diagram of an ultrasonic bonding apparatus according to Embodiment 1 of the invention.

FIG. 1 is a schematic configuration diagram of an ultrasonic bonding apparatus of the invention.

This ultrasonic bonding apparatus includes a wiring board holding portion 24 for holding a wiring board 14; on the side in the +Z direction of the wiring board holding portion 24 is provided a bonding mechanism 21 for bonding an electronic component 4 to the wiring board 14. An image capture mechanism 27 for capturing images of the electronic component 4 and wiring board 14 is provided between the wiring board holding portion 24 and the bonding mechanism 21. Further, a supply mechanism (not shown) for supplying the electronic component 4 to the bonding mechanism 21 is installed. In this ultrasonic bonding apparatus, by using a control portion 40 to control these mechanisms, bonding of the wiring board 14 and the electronic component 4 is performed.

The wiring board holding portion 24 comprises a stage 25 for holding the wiring board 14, and a stage movement mechanism 26 for moving the stage 25 in the X direction and the Y direction. The bonding mechanism 21 comprises a bonding head 23 and a raising/lowering mechanism 22 for moving (raising/lowering) the bonding head 23 in the Z direction. The image capture mechanism 27 comprises an image capture unit 28 for capturing images of the electronic component 4 and the wiring board 14, and an image capture unit movement mechanism 29 which moves in the X direction and the Y direction.

Figure 2:
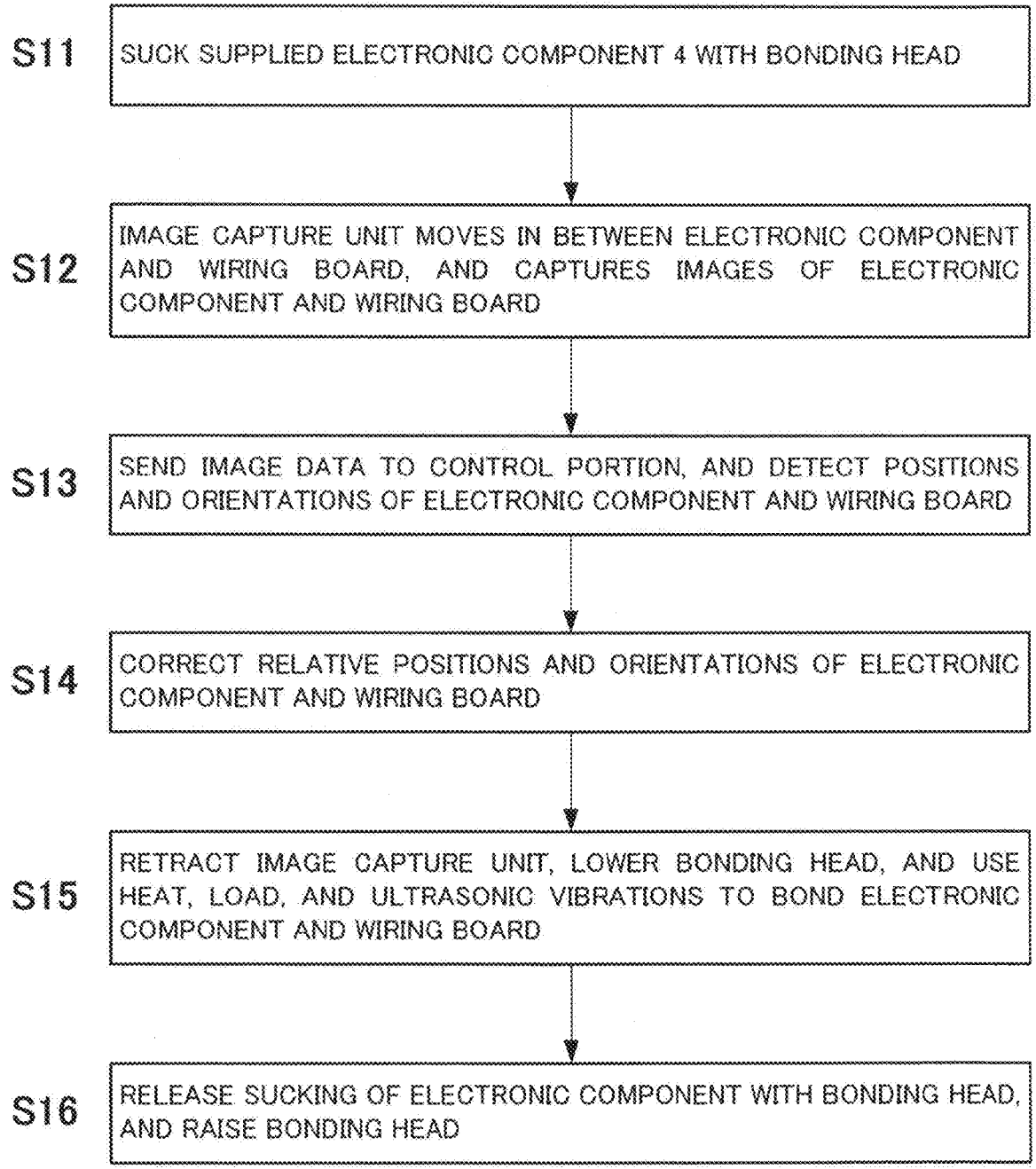
FIG. 2 is a flow diagram relating to a bonding operation according to the embodiment.

FIG. 2 is a flow diagram for the control portion 40 relating to operations to bond the electronic component 4 to the wiring board 14 using the ultrasonic bonding apparatus shown in FIG. 1.

The control portion 40 first sucks the electronic component 4 supplied by the supply mechanism using the bonding head 23 (S11).

Next, the image capture unit 28 moves between the electronic component 4 and the wiring board 14, and captures an image of the sucked electronic component 4 and the wiring board 14 being held by the stage 25 (S12).

Next, image data is sent to the control portion 40 and is compared with image data for the electronic component 4 and wiring board 14 stored in advance, and the position and orientation of the electronic component 4 and the wiring board 14 are detected (S13).

Next, the electronic component 4 and wiring board 14 are corrected to preset relative positions and orientations based on the detection results (S14).

The image capture unit 28 is retracted to a position where there is no contact with the electronic component 4 or bonding head 23, the bonding head 23 is lowered, and the electronic component 4 is pressed against and bonded to the wiring board 14 (S15).

Further, by releasing the sucking of the electronic component 4 by the bonding head 23 and raising the bonding head 23 (S16), one cycle of the bonding operation is completed.

In the process of correcting the electronic component 4 and wiring board 14 to the preset relative positions and orientations (S14), a movement mechanism provided separately on the bonding mechanism 21 may be used to perform correction, rather than using the stage movement mechanism 26 shown in FIG. 1.

FIG. 3 shows the profiles of ultrasonic vibration conditions and loading conditions for bonding the electronic component 4, as well as the portions of the electronic component 4 and wiring board 14 at different times during bonding.

In FIG. 3, (a) shows the ultrasonic vibration and loading condition profiles, (b1) through (b3) are cross-sectional views showing the electronic component 4 and the wiring board 14, and a bonding material 13 for bonding the electronic components 4 to the wiring board 14, at different times during bonding, and (c1) through (c3) show the areas of the contact faces between electrodes 12 of the electronic component 4 and the bonding materials 13 arranged on the side of the wiring board 14 at different times during bonding. In the diagrams, 5 indicates the direction of ultrasonic vibration.

Using FIG. 3, the relations between the profiles of ultrasonic vibration conditions and loading conditions, and the states of the electronic components 4 and wiring boards 14 at different times during bonding, are explained.

First, prior to applying ultrasonic vibration, loading alone is applied using a loading application member 11. That is, a wiring board 14, with bonding materials 13 placed on wiring electrodes 15 of the wiring board 14, and electronic components 4 are prepared (initial area 30, at 0 second in (a), with the wiring electrodes 15 in state (b1) and the electronic components 4 in state (c1)).

A load alone is then applied for t1 seconds (area 31, enlarged due to loading, at time 0 to t1 seconds in (a), with the wiring electrodes 15 in state (b2) and the electronic components 4 in state (c2)). The load F (N) applied at this time is a load having a sufficient value at which there is no shift in position of the electronic components 4 when ultrasonic vibration is applied after t1 (s).

Next, after time t1 seconds, ultrasonic vibration P (W) and the load F (N) are applied after t2 seconds, and the bonding profiles are completed (area 32, enlarged due to loading and ultrasonic vibration, at time t1 seconds to t2 seconds in (a), with the wiring electrodes 15 in state (b3) and the electronic components 4 in state (c3)).

Here, the area 31, enlarged due to the loading of the bonding materials 13 shown in (c2) of FIG. 3, has low bonding strength, and thus it is desirable that the load F (N) be sufficient so that there is no shift in position of the electronic components 4, and moreover have a small value.

In this embodiment, an example is explained of a bonding method in which the wiring board 14 on which the bonding material 13 is arranged on wiring in advance and the electronic component 4 are opposed and bonded to each other; but the bonding material 13 may be arranged in advance on the electronic component 4 as well. Further, the loading or ultrasonic vibration after t1 (s) need not necessarily be constant as shown in (a) of FIG. 3, and the factor controlling ultrasonic vibration need not be power in Watts, but may be voltage and current.

Figure 4:
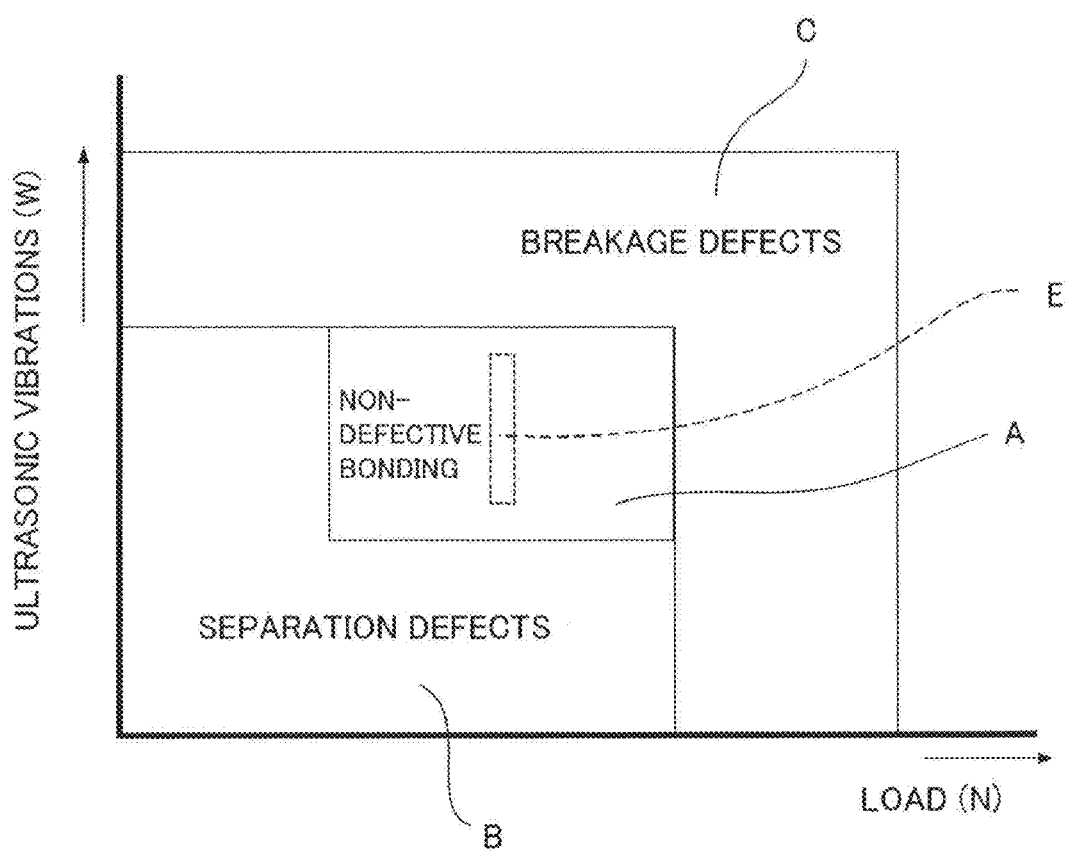
FIG. 4 explains the relation between loading conditions for loading at each bonded portion and ultrasonic vibration conditions of the electronic component according to the embodiment, and non-defective products and defective products for each bonded portion of the electronic component.

FIG. 4 explains the relation between loading conditions for loading at each bonded portion and ultrasonic vibration conditions of the electronic component 4 in this embodiment, and non-defective products and defective products for each bonded portion of the electronic component 4. The horizontal axis indicates the loading conditions for loading at each bonded portion, and the vertical axis indicates the ultrasonic vibration. In an area B of light loading or low ultrasonic vibration, the load energy is insufficient for bonding, so that there is electrical discontinuity at bonded portions where the electrodes of the electronic component 4 and the electrodes of the wiring board 14 are not bonded, or bonding strength is insufficient to secure the reliability required of a product (for example, the shear strength of the electronic component 4 with respect to the wiring board 14), or other bonding defects arising from insufficient bonding strength occur. And, in an area C of high loading or high ultrasonic vibration, excessive loading energy causes breakage of the electronic component 4 or the wiring board 14. In an area A, satisfactory bonding of the electronic component 4 and wiring board 14 can be achieved with appropriate loading and appropriate ultrasonic vibration. An area E indicates a range of bonding conditions actually applied to the electronic component.

As shown in FIG. 4, the load value and ultrasonic vibration, as the bonding conditions, must be set in the range in which bonding strength can be secured and moreover breakage of the electronic component 4 or the wiring board 14 does not occur; while depending on the bonding area and the characteristics of the bonding materials, a load of, for example, approximately 5 N to 500 N is preferable, while as the ultrasonic vibration converted into the equivalent ultrasonic amplitude when there is no loading, values of approximately 0.5 μm to 10 μm are preferable.

If, in addition to loading and ultrasonic vibration, heat is also applied to the bonded portions of the electronic component 4 and wiring board 14, then interdiffusion between the bonding material 13 and the electrodes 12 of the electronic component 4 as well as wiring electrodes 15 of the wiring board 14 is promoted, and bonding is possible under lighter loads and lower ultrasonic vibrations, so that the bonding condition margin is broadened, and still more stable quality can be obtained.

Figure 5:
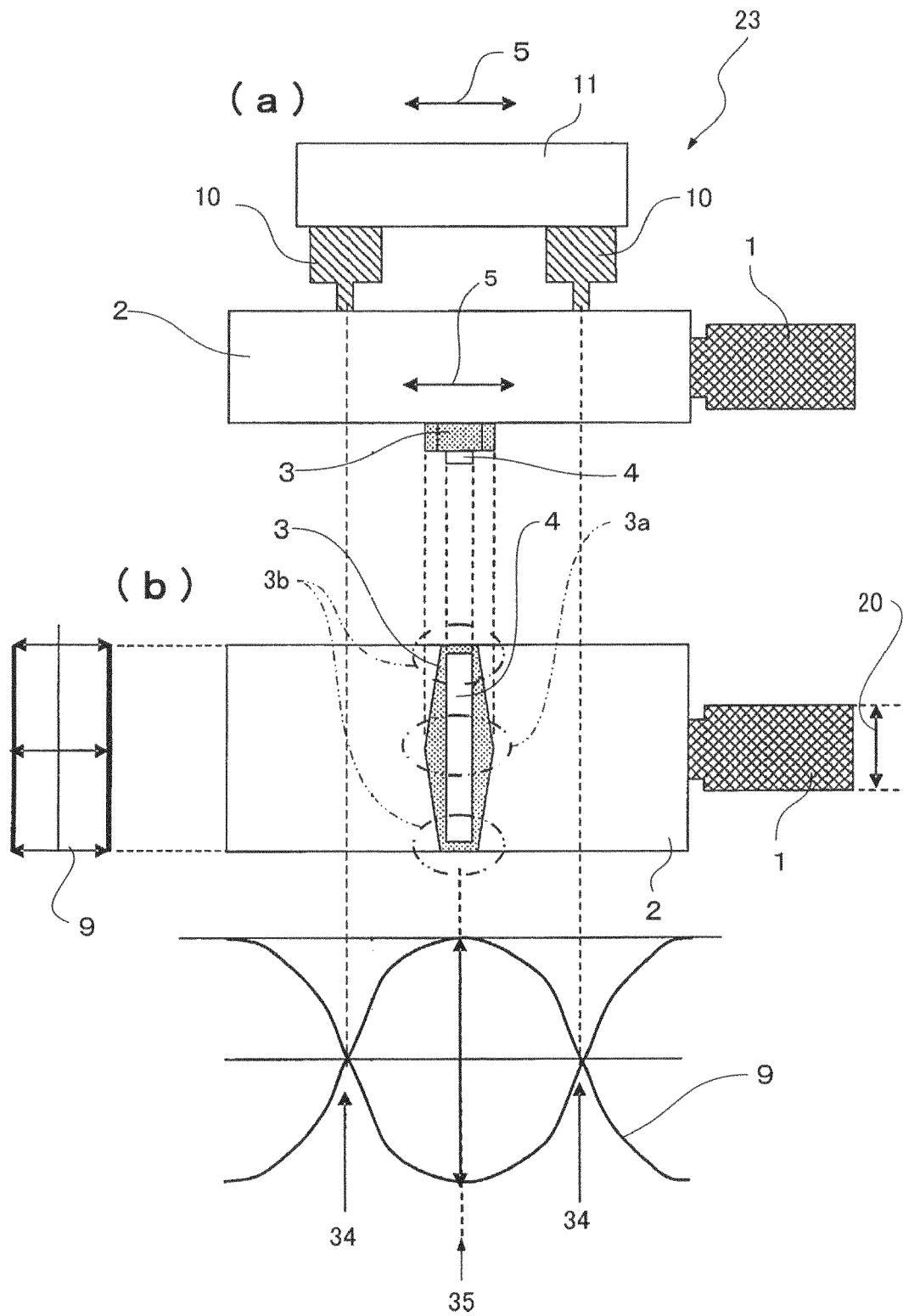
FIG. 5 shows a bonding head according to the embodiment, in which (a) is a cross-sectional view, the right in (b) is a bottom view, the left in (b) explains the relation between a position on a tool and ultrasonic amplitude when there is no loading, and the bottom in (b) explains the relation between an ultrasonic horn and ultrasonic amplitude when there is no loading.

FIG. 5 shows the bonding head 23 shown in FIG. 1.

In FIG. 5, (a) is a partial front cross-sectional view of the bonding head 23, and on the right in (b) is a bottom view of the bonding head 23; 20 is the ultrasonic vibrator length of an ultrasonic vibrator 1. On the left in (b) is an explanatory diagram showing the relation between the position on a tool 3 and the ultrasonic amplitude when there is no loading; on the bottom in (b) is an explanatory diagram showing the relation between the ultrasonic horn and the ultrasonic amplitude when there is no loading.

In FIG. 5, the electronic component 4 held by the bonding head 23 is also shown. Further, an ultrasonic amplitude 9 when there is no loading, shown on the left in (b), approximately represents the amount of transmission of ultrasonic vibrations when a load is applied.

As shown in FIG. 5, the bonding head 23 comprises the tool 3 for sucking the electronic component 4, the ultrasonic vibrator 1 for generating ultrasonic vibrations, an ultrasonic horn 2 for transmitting ultrasonic vibrations to the tool 3, a support member 10 for the ultrasonic horn 2, and the load application member 11. The ultrasonic horn 2 has a maximum amplitude point 35 for ultrasonic vibrations in the center portion in the length direction, and the tool 3 is arranged in the center portion of the ultrasonic horn 2, which is the maximum amplitude point 35 for ultrasonic vibrations. By means of this configuration, ultrasonic vibrations can be transmitted to the electronic component 4 with maximum efficiency.

The ultrasonic vibrator 1 is arranged at one end in the length direction of the ultrasonic horn 2, and the ultrasonic vibrator 1 generates ultrasonic vibrations in the ultrasound length direction. The ultrasonic horn 2 is fixed in place by the support member 10 at only a nodal portion (node) 34 of the ultrasonic vibration. By means of this configuration, the ultrasonic horn 2 can be held without impeding the ultrasonic vibration of the ultrasonic horn 2.

The load application member 11 which applies a load to the tool 3 is arranged on the position of the tool 3 at the maximum amplitude point 35 of the ultrasonic horn 2, and is fixed in place on the ultrasonic horn support member 10 of the ultrasonic horn 2. In this case, a bearing may be arranged on the load application member 11, and a configuration may be employed in which the face including the ultrasonic horn maximum amplitude point 35 on the face opposite the tool 3 where the ultrasonic horn 2 is arranged is in contact with the bearing.

The tool 3 is formed from stainless steel, an ultra-hard alloy, or hardened steel, which has preferred vibration characteristics and vibration transfer characteristics in bonding of the electronic components 4, and the tool 3 has in the center portion a suction path for vacuum suction which is used for sucking and holding of the electronic components 4.

As shown in (b) of FIG. 5, the shape of the tool 3 in Embodiment 1 is set so as to pass through the center axis of the ultrasonic vibrator 1, and the cross-sectional area of a center portion 3a of the tool 3 in the horizontal direction with respect to the contact face with the electronic component 4, is set to be larger than the cross-sectional areas of end portions 3b as other regions of the tool 3. That is, in the direction parallel to the direction of ultrasonic vibration imparted from the ultrasonic vibrator 1, the shape of the center portion 3a of the tool 3 and the shape of the end portions 3b of the tool 3 are modified, so that the cross-sectional areas are different, and in the direction parallel to the direction 5 of ultrasonic vibration imparted from the ultrasonic vibrator 1, the thickness at the center portion 3a of the tool 3 is made greater than the thicknesses at the end portions 3b of the tool 3.

By means of this configuration, as shown in (b) of FIG. 5, the ultrasonic amplitude 9 perpendicular to the ultrasonic vibration direction 5 is substantially the same. That is, the difference in ultrasonic vibration is either eliminated or reduced, so that the difference in the transmission of ultrasonic vibrations between at the center portion 3a and at the end portions 3b perpendicular to the ultrasonic vibration direction 5 in the electronic component 4 can be either eliminated or reduced.

The difference in the transmission of ultrasonic vibrations between at the center portion 3a and at the end portions 3b perpendicular to the ultrasonic vibration direction 5 in the electronic component 4 can be eliminated or reduced, so that as shown in (b1) through (b3) in FIG. 3 the difference in areas enlarged by the load and ultrasonic vibration at the center portion and end portion electrodes 12, 15 perpendicular to the ultrasonic vibration direction 5 in the electronic component 4 can be eliminated or reduced. Further, the difference in bonding strengths of the electrodes 12, 15 at the center portion and end portions perpendicular to the ultrasonic vibration direction 5 in the electronic component 4 can be eliminated or reduced, and the difference in loads imparted to the electrodes 12, 15 at the center portion and end portions perpendicular to the ultrasonic vibration direction 5 in the electronic component 4 at the time of bonding can be eliminated or reduced.

Hence as regards the range of bonding conditions actually applied to each bonded portion of the electronic component 4, for example as shown in FIG. 4, in the area A of non-defective bonded products, rather than the area B in which insufficient bonding strength defects occur due to light loading or low ultrasonic vibration and the area C in which breakage defects of the electronic components or the wiring board occur due to high loads and high ultrasonic vibration, the range of bonding conditions applied over the entire face of the same electronic component is much smaller than the range of bonding conditions in the prior art, so that bonding conditions can easily be set to satisfy both the requirement of bonding strength and the requirement of no breakage for all the bonded portions of the electronic components and the wiring board, and the maintenance of bonding conditions in mass production can be easily achieved.

Further, the tool 3 need not be integral with the ultrasonic horn 2, and the tool 3 may be removeably installed on the ultrasonic horn 2. Further, the method of holding the electronic component 4 with the tool 3 is not limited to suction, and electrical or magnetic sucking may be used for holding the electronic component 4.

Further, as the materials of the members, a piezoelectric element is suitable for the ultrasonic vibrator 1, and stainless steel or the like is suitable for the ultrasonic horn 2; however, the ultrasonic horn 2 may be any material capable of transmitting ultrasonic vibrations generated by the ultrasonic vibrator 1.

Referring to the perspective views of principal portions shown in FIG. 6 through FIG. 10, modified examples of the tool 3 of Embodiment 1 are explained.

The configurations of tools 3 are described in modified examples in which, in order to secure advantageous effects similar to those of Embodiment 1 above, the shape (cross-section) of a center portion 3a of the tool 3 and the shapes (cross-section) of end portions 3b of the tool 3 are modified in a direction perpendicular to a direction 5 of ultrasonic vibrations imparted from an ultrasonic vibrator 1, and the materials (composition) of the center portion 3a of the tool 3 and the materials (composition) of the end portions 3b of the tool 3 are modified.

Figure 6:
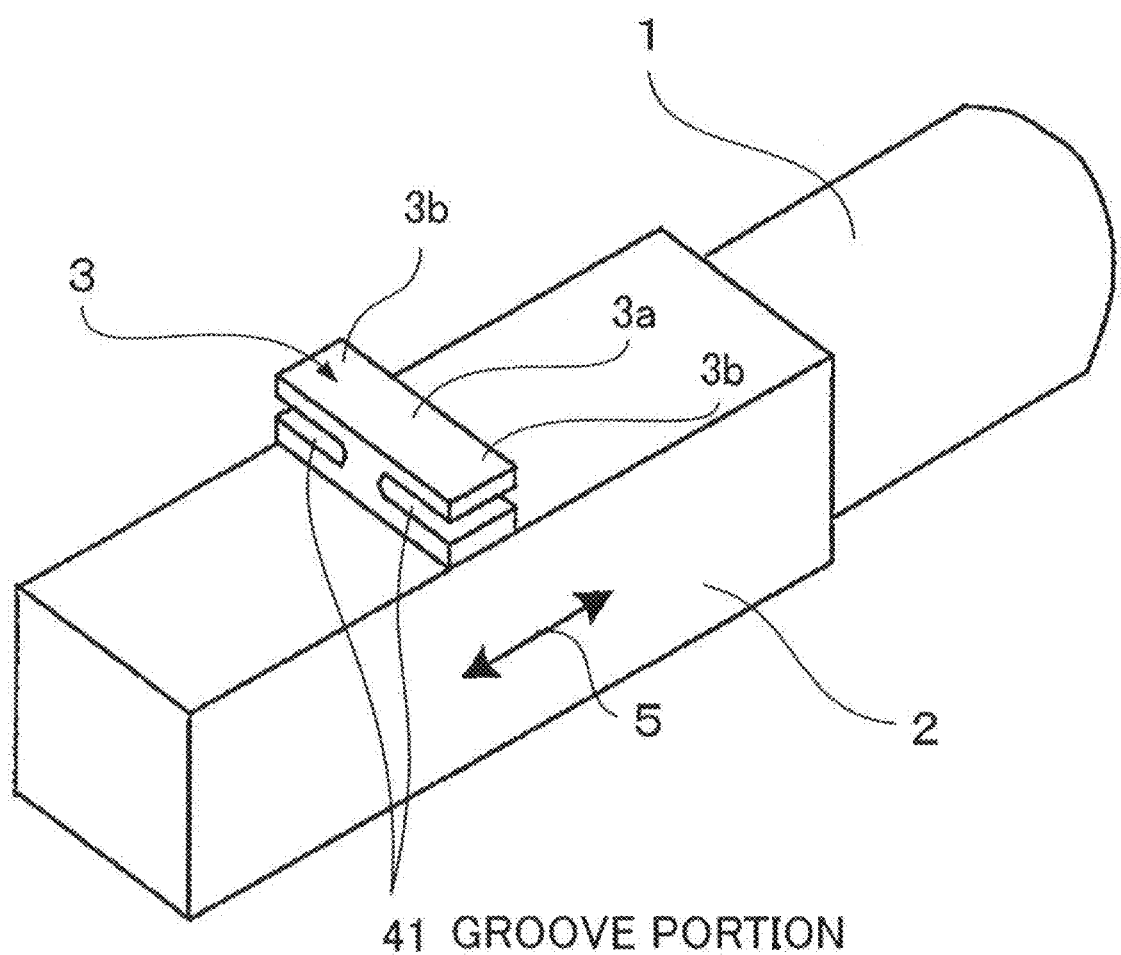
FIG. 6 is a perspective view showing the tool in a modified example of Embodiment 1, from the direction of a component holding face.

In the example of FIG. 6, groove portions 41, 41 are formed in a side face of the tool 3 parallel to the direction 5 of ultrasonic vibrations imparted from the ultrasonic vibrator 1, passing through the center axis of the ultrasonic vibrator 1. The widths and depths of the groove portions 41, 41 are set to such that the difference in vibrations between at the center portion 3a and at the end portions 3b of the tool 3 is eliminated or reduced.

The shape of the groove portions 41 is not limited to the shape shown in FIG. 6. Further, a plurality of groove portions 41, 41 may be formed.

Figure 7A:
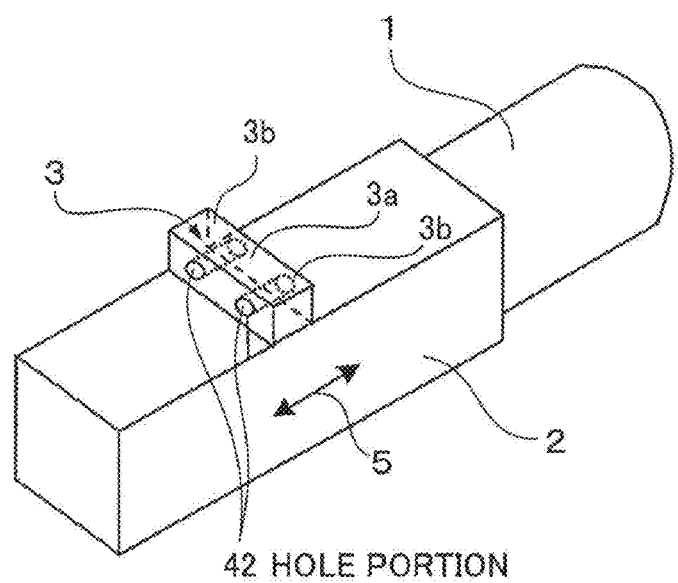
FIG. 7 is perspective views (a) and (b) exhibiting the tool in another modified example of Embodiment 1, from the direction of the component holding face.
Figure 7B:
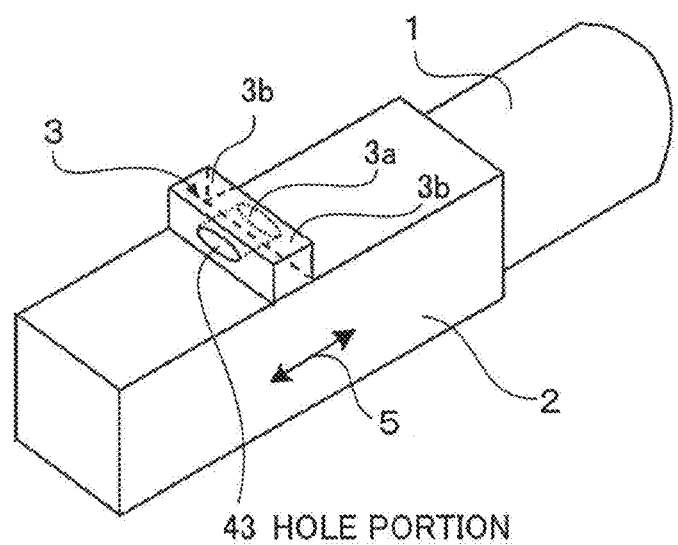

In the examples of (a) and (b) of FIG. 7, hole portions 42 or a hole portion 43 are formed in the tool side faces perpendicular to the direction 5 of ultrasonic vibrations imparted from the ultrasonic vibrator 1. The hole portions 42, 42 of the example in (a) of FIG. 7 are formed in the end portions 3b of the tool 3; the cross-sectional area of the center portion 3a in the tool 3, passing through the center axis of the ultrasonic vibrator 1 and perpendicular to the contact face with the electronic component 4, is set to be larger than the cross-sectional areas of the end portions 3b as other regions in the tool 3.

On the other hand, the hole portion 43 of the example of (b) of FIG. 7 is formed in the center portion 3a of the tool 3, and the cross-sectional area of the center portion 3a in the tool 3, passing through the center axis of the ultrasonic vibrator perpendicular to the contact face with the electronic component, is set to be smaller than the cross-sectional areas of the end portions 3b as other regions in the tool 3.

The shapes and sizes of the hole portions 42, 43 are set such that the difference in vibrations between at the center portion 3a and at the end portions 3b of the tool 3 is eliminated or reduced. A plurality of hole portions 42, 43 may be formed.

Figure 8:
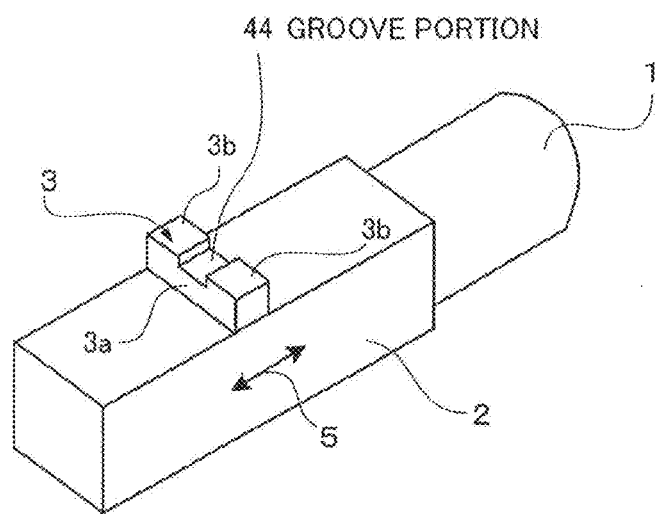
FIG. 8 is a perspective view showing the tool in another modified example of Embodiment 1, from the direction of the component holding face.

In the example of FIG. 8, a groove portion 44 is formed in the center portion 3a of the component holding face, which serves as the top face of the tool 3, such that the cross-sectional area of the center portion 3a of the tool 3, passing through the center axis of the ultrasonic vibrator and perpendicular to the contact face with the electronic component, is smaller than the cross-sectional areas of the end portions 3b as other regions in the tool 3. The width and depth of the groove portion 44 are set such that the difference in vibrations between at the center portion 3a and at the end portions 3b of the tool 3 is eliminated or reduced.

The shape of the groove portion 44 is not limited to the shape shown in FIG. 8. Further, a plurality of groove portions 44 may be formed.

Figure 9:
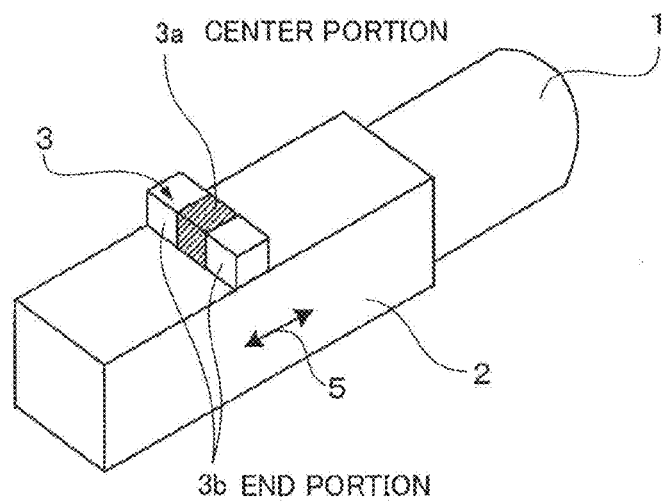
FIG. 9 is a perspective view showing the tool in another modified example of Embodiment 1, from the direction of the component holding face.

In the example of FIG. 9, the material (material properties) of the center portion 3a of the tool 3 and the materials (material properties) of the end portions 3b of the tool 3 are different. The types of materials and the range of placement of the materials are selected such that the difference in vibrations between at the center portion 3a and at the end portions 3b of the tool 3 is eliminated or reduced.

Figure 10:
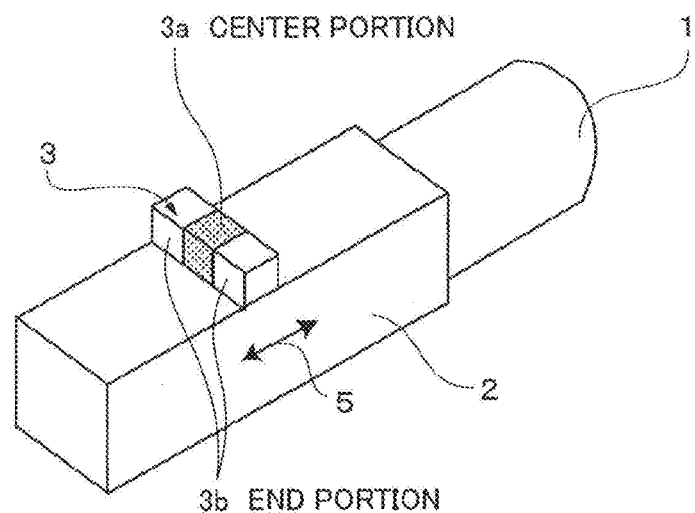
FIG. 10 is a perspective view showing the tool in another modified example of Embodiment 1, from the direction of the component holding face.

In the example of FIG. 10, the material composition of the center portion 3a of the tool 3 and the material texture (material microstructure) of the end portions 3b of the tool 3 are different. For example, through a thermal process using the same material, the texture of the center portion 3a of the tool 3 and the texture of the end portions 3b of the tool 3 are changed.

As the thermal process, for example, high-frequency quench hardening, nitriding, and the like are effective, but any thermal process may be used as long as the difference in vibrations between at the center portion 3a and at the end portions 3b of the tool 3 is eliminated or reduced.

Embodiment 2

Figure 11:
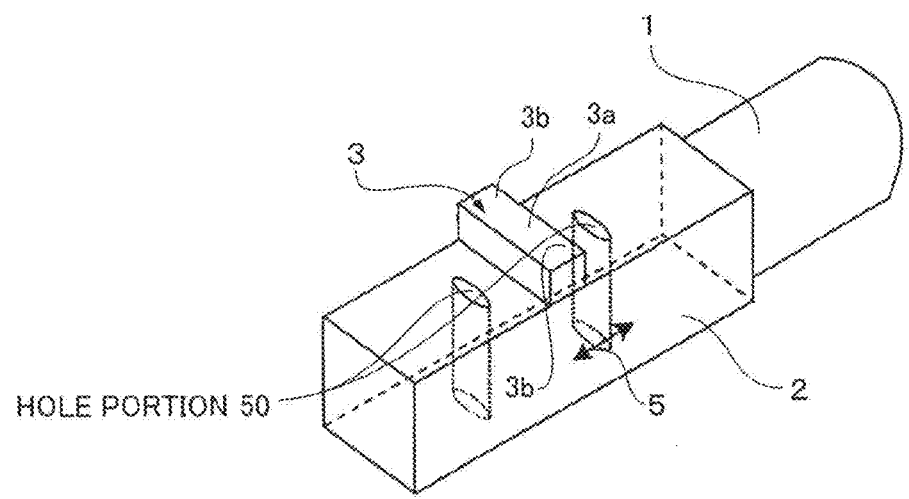
FIG. 11 is a perspective view showing a tool of an ultrasonic bonding apparatus according to Embodiment 2 of this invention, from the direction of a component holding face.
Figure 14:
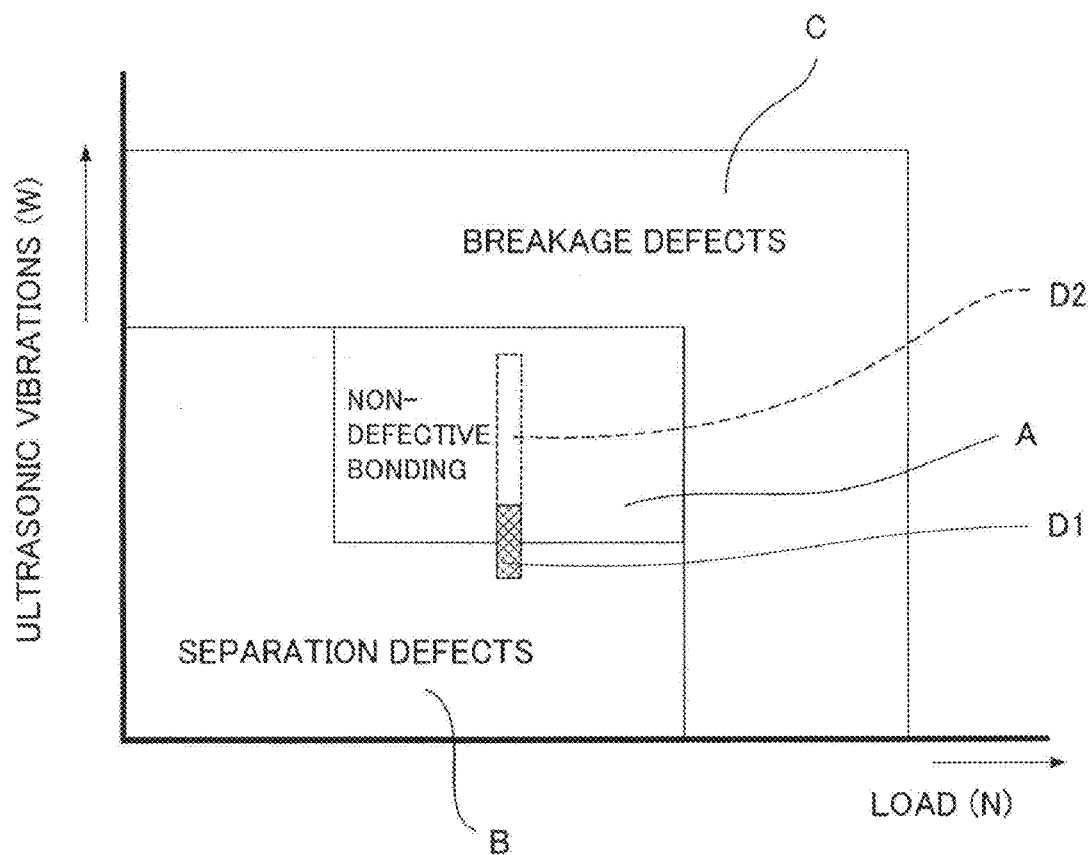

Further, in addition to any one of the tools 3 described in the above Embodiment 1, an ultrasonic horn 2 can be configured as shown in FIG. 11 or FIG. 12, and the magnitude of ultrasonic vibration acting on an electronic component 4 can be altered.

FIG. 11 is a perspective view showing the ultrasonic horn 2 and a portion of the tool 3 in Embodiment 2.

Hole portions 50 are formed in the ultrasonic horn 2. In this example, the hole portions 50 are formed in the ultrasonic horn 2, in portions on both sides of the tool 3, parallel to a direction 5 of ultrasonic vibrations imparted from an ultrasonic vibrator 1. The shape and size of the hole portions 50 are set such that the difference in vibrations between at the center portion 3a and at the end portions 3b of the tool 3 is eliminated or reduced. Further, a plurality of groove portions 50 may be formed.

In FIG. 12, protruding portions 51 are formed on side faces of the ultrasonic horn 2, parallel to the direction 5 of ultrasonic vibrations imparted from the ultrasonic vibrator 1. The shape and size of the protruding portions 51 are set such that the difference in vibrations between at the center portion 3a and at the end portions 3b of the tool 3 is eliminated or reduced. Further, a plurality of protruding portions 51 may be formed.

Embodiments of the invention are described as above, but the invention is not limited to these embodiments, and various modifications, combinations of embodiments, and the like are possible.

The ultrasonic bonding apparatuses of the embodiments configured as described above are suitable for mounting driver ICs for driving image display devices in which semiconductor chips have to be mounted, and are also suitable for mounting various types of electronic components in addition to driver ICs for driving image display devices, such as semiconductor light-emitting elements, SAW (Surface Acoustic Wave) filters, semiconductor bare-chip components, and the like.

INDUSTRIAL APPLICABILITY

By means of this invention, when bonding electronic components onto a wiring board, both sufficient bonding of the electronic components with the wiring board as well as prevention of breakage can be achieved simultaneously, and the invention is useful for various technologies employing ultrasound to mount electronic components on wiring boards.

The invention claimed is:

1. An electronic component mounting apparatus for transmitting ultrasonic vibrations generated from an ultrasonic vibrator, via an ultrasonic horn and a tool, to an electronic component on a wiring board, and causing the electronic component and the wiring board to be bonded to each other, wherein the tool has a contact face to transmit ultrasound that is to be in contact with the electronic component, and a length of a center portion of the contact face intersecting with a plane passing through a center axis of the ultrasonic vibrator is greater than a length of each of two end portions of the contact face parallel to the center portion of the contact face.

2. The electronic component mounting apparatus according to claim 1, wherein a width in a direction of the center portion of the contact face decreases with distance from the center portion.

3. The electronic component mounting apparatus according to claim 1, further comprising a support member for supporting a nodal portion of ultrasonic vibrations of the ultrasonic horn.

4. An electronic component mounting method of mounting an electronic component on a wiring board by employing ultrasound, by use of the electronic component mounting apparatus according to claim 1, the method comprising the steps of:
   imparting ultrasonic vibrations from the ultrasonic vibrator to the electronic component held by the tool; and
   pressing the electronic component against the wiring board, with the tool between the electronic component and the ultrasonic horn.

5. The electronic component mounting apparatus according to claim 1, further comprising a wiring board holding portion for holding the wiring board.

* * * * *